United States Patent [19]

Flaim et al.

[11] Patent Number: 5,057,399
[45] Date of Patent: Oct. 15, 1991

[54] METHOD FOR MAKING POLYIMIDE MICROLITHOGRAPHIC COMPOSITIONS SOLUBLE IN ALKALINE MEDIA

[76] Inventors: Tony Flaim, Rte. 3, Box 3257, St. James, Mo. 65559; James Lamb, 1511 Science Dr., Rolla, Mo. 65401; Gregg Barnes, 1324 Woodhill, Lebanon, Mo. 65401; Terry Brewer, Rte. 2, Box 297, Rolla, Mo. 65401

[21] Appl. No.: 331,355

[22] Filed: Mar. 31, 1989

[51] Int. Cl.[5] ............................ G03F 7/30; G03F 7/40
[52] U.S. Cl. .................................. 430/313; 430/299; 430/327; 430/323; 430/271; 430/330; 430/325; 430/326
[58] Field of Search ............... 430/299, 327, 323, 313, 430/271, 270, 280, 330, 325, 326

[56] References Cited

U.S. PATENT DOCUMENTS

| | | | |
|---|---|---|---|
| 4,451,551 | 5/1984 | Kataoka et al. | 430/270 |
| 4,548,891 | 10/1985 | Riediker et al. | 430/330 X |
| 4,659,650 | 3/1987 | Moritz et al. | 430/330 X |
| 4,880,722 | 11/1989 | Moreau et al. | 430/326 X |

FOREIGN PATENT DOCUMENTS 0300326  1/1989  European Pat. Off. .

Primary Examiner—Cynthia Hamilton

[57] ABSTRACT

Nonamic acidic functionalized diamines and dianhydrides are condensed to produce abnormal acid functionalized polyamic acid/imide resins which surprisingly afford effective lift-off, by alkaline media, even after higher imidization.

16 Claims, 18 Drawing Sheets

Figure 1. IBM Metal Lift-off Process Using Dry-Processible Release Layer
(U.S. Patent 3,873,361)

PRIOR ART

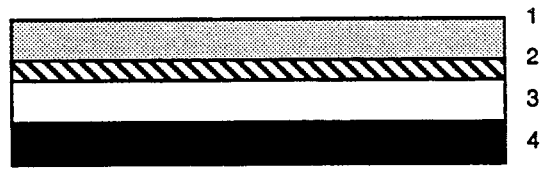

Fig. 1a. Multilayer resist structure used for lift-off processing.

1=Photoresist
2=Metal, Spin-on-glass or CVD glass
3=Release layer (dry-developable)
4=Substrate

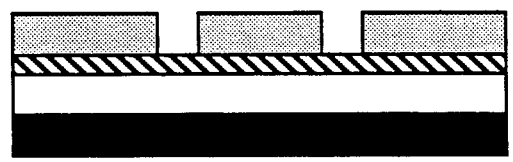

Fig. 1b. The photoresist layer is exposed and developed.

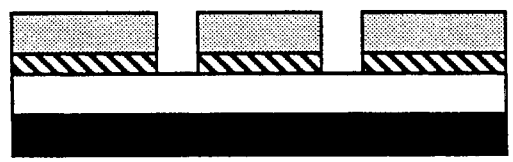

Fig.1c. The photoresist pattern is transferred into the glass or metal layer by a suitable wet or dry process.

Fig. 1d. Oxygen reactive ion etching is applied to create an undercut pattern in the release layer; the photoresist is removed at the same time.

Fig. 1e. Metal is deposited on the specimen by evaporation or sputtering through the metal/glass-release layer mask.
5 = Metal
Fig. 1f. The masking structure is removed by dissolving the release layer with an organic solvent, leaving the desired metal features on the structure.

Figure 2. Trilevel Process Using Dry-Developable Planarizing Layer
(or Thick Release Layer)

PRIOR ART

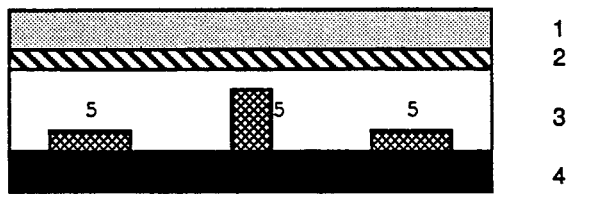

Fig. 2a. A trilevel resist structure incorporating a thick, planarizing release layer.

1 = Photoresist
2 = Spin-on-glass, deposited oxide or nitride, or metal (evaporated or sputtered)
3 = Relatively thick planarizing layer of release layer material
4 = Substrate
5 = Device features

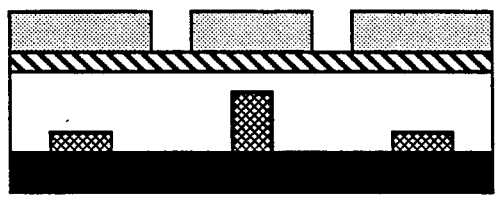

Fig. 2b. The photoresist is exposed and developed.

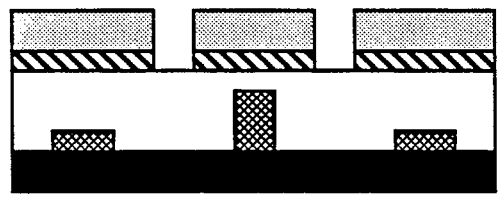

Fig. 2c. The photoresist pattern is transferred into the glass or metal layer by a suitable wet or dry process.

Fig. 2d. Oxygen reactive ion etching is then applied to transfer the photoresist pattern into the release layer anisotroically; the photoresist is removed at the same time.

Fig. 2e. The substrate is etched, implanted, or coated through the metal/glass-release layer masking structure.
Fig. 2f. The masking structure is removed by dry etching or dissolving the thick planarizing film with an organic solvent.

Figure 3. IBM Ion Milling Process For Metal Interlayers Using
Dry-Developable Release Layer System

PRIOR ART

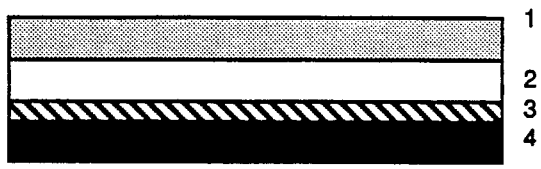

Fig. 3a. A multilevel resist structure for dry etch patterning of a metal layer.

1=Photoresist
2=Release Layer
3=Metal
4=Substrate

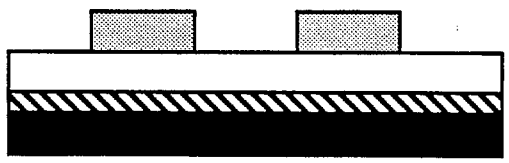

Fig. 3b. The photoresist is exposed and developed and then plasma hardened to make it resistant to reactive ion etching.

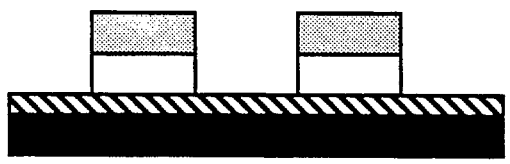

Fig. 3c. The photoresist pattern is transferred into the release layer by reaction ion etching.

Fig. 3d. The metal layer is now patterned by ion milling using the photoresist-release layer structure as a mask.

Fig. 3e. The masking structure is removed by dissolving the release layer with an organic solvent.

Figure 4. Metal-Over-Release Layer Ion Implantation Mask

PRIOR ART

Fig. 4a. A bilevel resist comprised of photoresist over release layer.
1=Photoresist
2=Release layer
3=Substrate

Fig. 4b. The photoresist is exposed and developed.

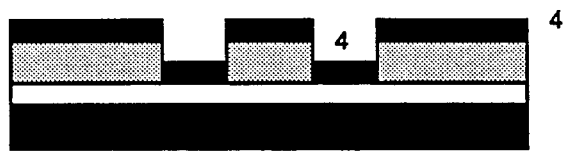

Fig. 4c. Metal is deposited on the specimen by evaporation or sputtering.

4=Metal

Fig. 4d. The photoresist is stripped away removing with it any overlying metal.

Fig. 4e. The remaining metal structure is used as a mask for patterning the release layer by oxygen reactive ion etching.
Fig. 4f. The substrate is ion implanted through the metal-release layer mask.
5=Ion implanted zone in substrate.
Fig. 4g. The masking structure is removed by dissolving the release layer with an organic solvent.

Figure 5. Imaging Process for a Wet-Developable Release Layer Under Postive Photoresist

Fig. 5a. A release layer film is spincoated on the substrate and baked to remove solvents.

1 = Release layer
2 = Substrate

Fig. 5b. A photoresist is spincoated over the release layer film and soft baked.

3=Photoresist

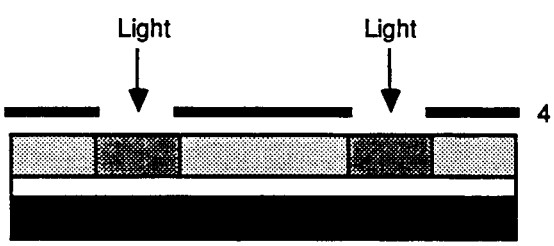

Fig. 5c. The photoresist is exposed through a mask creating a latent image in the photoresist.

4=Mask

Fig. 5d. The photoresist and release layer are developed in dilute aqueous base, producing features with non-vertical walls in the release layer level.

Figure 6. Process for Application of Polyimide Coatings Starting from a Polyamic Acid Solution

Fig. 6a. A polyamic acid film is spincoated onto the substrate and baked at 150°C-180°C to remove solvents and cause partial imidization of the polyamic acid.

1=Polyamic Acid Coating
2=Substrate

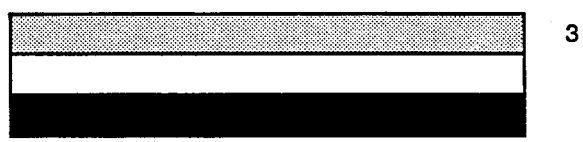

Fig. 6b. Positive photoresist is applied over the polyamic acid film and soft baked.

3=Photoresist

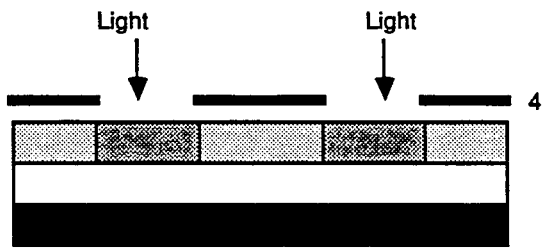

Fig. 6c. The photoresist is exposed through a mask creating a latent image in the photoresist layer.

4=Mask

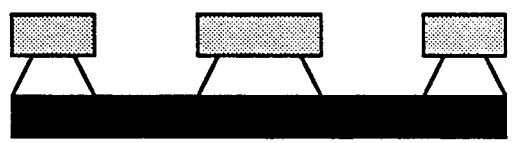

Fig. 6d. The photoresist and polyamic acid layer are developed in dilute aqueous base producing features with non-vertical walls in the polyamic acid level.

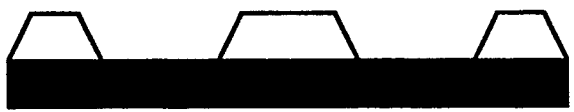
Fig. 6e. The photoresist is stripped away with a solvent that does not attack the polyamic acid layer.
Fig. 6f. The patterned polyamic acid film is baked at >200°C to convert it to a polyimide form; some z-axis shrinkage occurs.

Figure 7. Polyamic Acid Chemistry
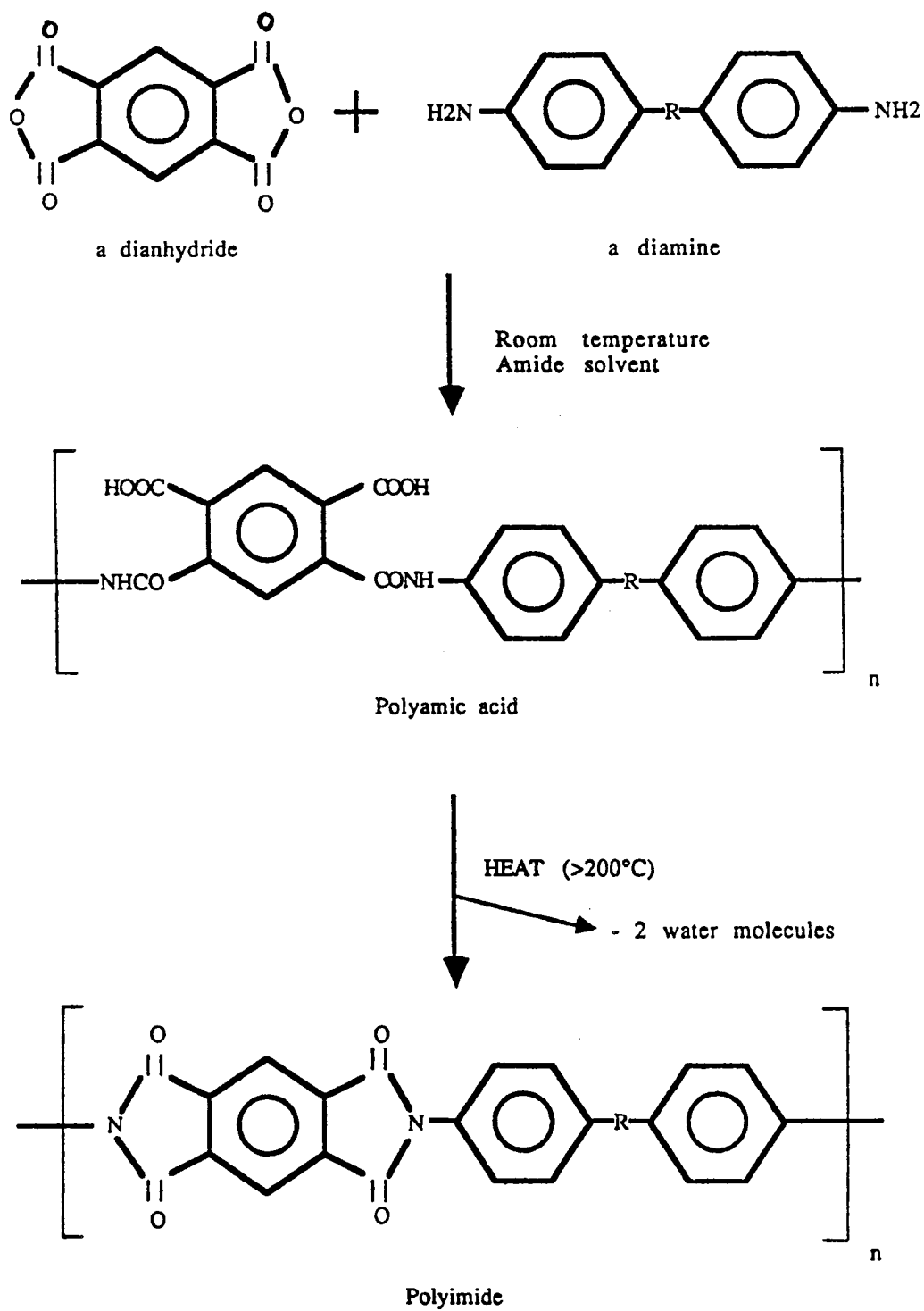

Figure 8. Process Using Wet-Developable Release Layer to Assist the Removal of High Temperature Baked Photoresist

Fig. 8a. A bilevel resist stucture comprised of photoresist over a wet developable release layer.

1=Photoresist
2=Release layer (wet developable)
3=Substrate

Fig. 8b. The photoresist and release layer are developed in dilute aqueous base, producing features with non-vertical walls in the release layer level.

Fig. 8d. The structure is baked at temperatures >150° causing photoresist deformation and converting the photoresist to a chemically intractable form.

Fig. 8e. After substrate processing, the photoresist-release layer features are lifted off by dissolving the release layer in an alkaline medium.

Figure 9. Ion Implantaion Process Using Wet-Developable Release Layer to Assist Resist Removal After Implantation

Fig. 9a. A bilevel resist structure comprised of photoresist over a wet-developable release layer.

1=Photoresist
2=Release layer (wet-developable)
3=Substrate

Fig. 9b. The photoresist and release layer are developed in dilute aqueous base, producing features with non-vertical walls in the release layer level.

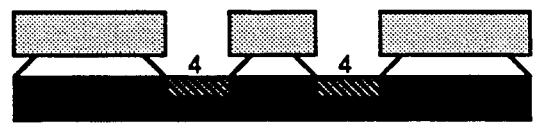

Fig. 9c. The substrate is ion implanted rendering the upper surface of the photoresist chemically intractable.

4=Ion implanted zone in substrate.

Fig. 9d. The photoresist-release layer implantation mask is lifted off by dissolving the release layer in an alkaline medium.

Figure 10. Metal Lift off Process Using Wet Developable Release Layer

Fig. 10a. A bilevel resist structure comprised of photoresist over wet-developable release layer.
1=Photoresist
2=Release layer
3=Substrate

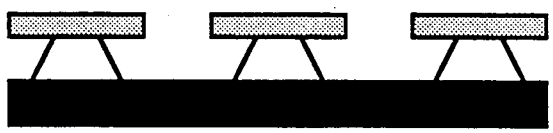

Fig. 10b. The photoresist and release layer are developed in dilute aqueous base, producing features with non-vertical walls in the release layer level.

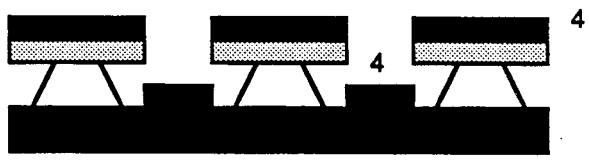

Fig. 10c. Metal is deposited on the specimen by evaporation or sputtering through the photoresist-release layer mask.

4=Metal

Fig. 10d. The masking structure is lifted off by dissolving the release layer in an alkaline medium, leaving the desired metal features on the substrate.

Figure 11. Process Using a Thick, Wet Developable Polyimide Release Layer as a Planarizing Film.

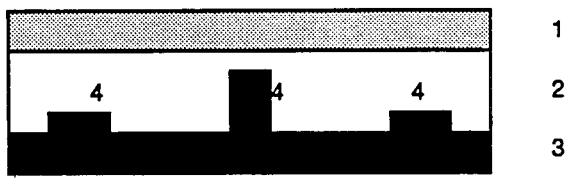

Fig. 11a. A bilevel resist structure comprised of photoresist over a thick, planarizing, wet-developable release layer.

1=Photoresist
2=Relatively thick polyimide release layer (wet developable)
3=Substrate
4=Device features

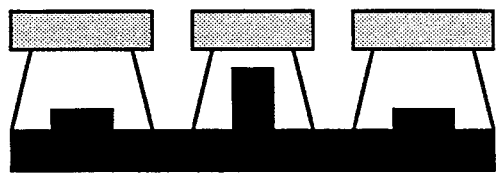

Fig. 11b. The photoresist and release layer are developed in dilute aqueous base, producing features with non-vertical walls in the release layer level.

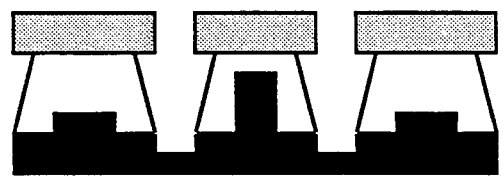

Fig. 11c. The photoresist pattern is transferred into the substrate by reactive ion etching through the photoresist-release layer mask.

Fig. 11d. The masking structure is removed by dissolving the release layer in an alkaline medium.

Figure 12. Process Using Aqueous Base-Soluble Polyimide Film To Remove Epoxy Encapsulant

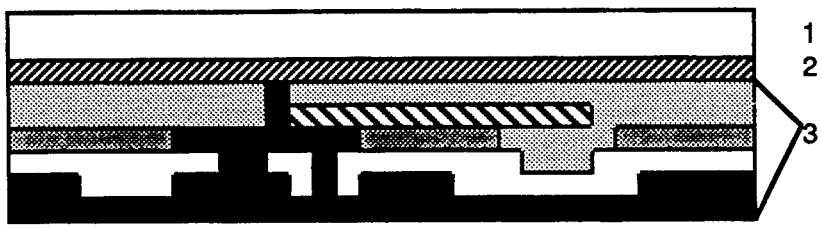

Fig. 12a. A multi-level device encapsulated with an epoxy or inorganic coating applied over a base-soluble polyimide release layer film.

1=Protective epoxy or inorganic coating (insoluble)
2=Polyimide release film (base-soluble)
3=Multilevel circuitry of the active device

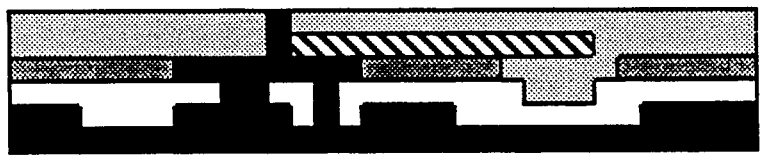

Fig. 12b. Immersion in an alkaline medium lifts off the encapsulant by dissolving the release layer film.

Figure 13. Examples of Aqueous Base-Soluble Polyimides Which Are Useful for Release Layer Technology

METHOD FOR MAKING POLYIMIDE MICROLITHOGRAPHIC COMPOSITIONS SOLUBLE IN ALKALINE MEDIA

BACKGROUND OF THE INVENTION

The present invention generally relates to new and improved polyamic acid/imide microlithographic compositions, their method of manufacture, and particularly their use in a novel concurrent wet-development and improved lift-off process.

Photoresist compositions are commonly used in microlithographic processing and generally consist of a diazoquinone photosensitizer and a novolak resin binder. Normally, such compositions are coated onto semi-conductor substrates; and, when exposed to light of the proper wavelength, they are chemically altered in their solubility to alkaline developer solutions. Positive-working photoresists are initially insolbule in the alkaline developer, but after exposure to light, the exposed regions will dissolve or "wet-develop" in alkaline solution forming indented, micro-size line features. Subsequently, for many applications, the undissolved portion of the resist must be stripped from the substrate.

Positive-working novolak photoresists, however, are being increasingly used under conditions which render them insoluble in conventional strippers. Ion implantation, plasma hardening, deep UV hardening and other high temperature processing conditions produce, for example, crosslinking reactions within the resist. This makes stripper penetration and resist dissolution, which are essential to removal of the resists, virtually impossible.

Oxidative strippers such as hot sulfuric acid-hydrogen peroxide mixtures can be effective against intractable resists, but removal is often slow or incomplete. Moreover, these treatments are restricted to use on unmetallized substrates. Alternatively, removal of intractable resists is sometimes possible by soaking in hot chlorinated and/or phenolic solvents. However, toxicity and disposal problems associated with these materials are critical drawbacks to their use.

In the past there have been attempts to remove, otherwise intractable, photoresist compositions from metallized substrates with safe stripper solvents, devoid of the prior art problems. For example, IBM's U.S. Pat. No. 3,873,361 taught that novlak photoresist hardbaked at 210 degrees centigrade could be stripped with the conventional stripper solvent N-methyl pyrrollidone. Although this liftoff process was specifically designed to accommodate the formation and removal of metallic masking layers above the resist, in practice, it simply failed to work because the N-methyl pyrollidone did not dissolve the hardened photoresist.

subsequently, IBM and others developed special solvent-soluble, liftoff (release) layers which were sandwiched between the substrate and either glass FIGS. 1 and 2), the photoresist (FIG. 3), or the metal mask (FIG. 4). Disclosures of such release layer technology may be found in the following list of prior art publications.

L. J. Fried, J. Havas, J. S. Lechaton, J. S. Logan, G. Paal and P. A. Totta, IBM J. Res. Develop., 26(3), 362 (1982).

B. J. Lin in *Introduction to Microlithography; Theory, Materials and Processing*; ACS Symposium Seris Vol. 219, L. F. Thompson, C. G. Willson, and M. J. Bowne, Eds.; American Chemical Society (Washington); p. 287, 1983.

J. Moran and D. Maydan, J. Va. Sci. Technol., 16(6), 1620 (1979).

D. M. Tennant, J. Vac. Sci. Technol., B1(2), 494 (1983)

J. A. Underhill, V. C. Nguyen, M. Kerbaugh, and D. Sundling i *Advances in Resist Technology and Processing II* (1985); SPIE vol. 539; Society of Photo-Optical Instrumentaiton Engineers (Bellingham); p. 83, 1985.

P. Grabbe, E. L. Hu, and R. E. Howard, J. Vac. Sci. Technol, 21(1), 33 (1982).

K. G. Sachdev, R. W. Kwong, M. R. Gupta, J. S. Chece, and J. S. Sachdev, U.S. Pat. No. 4,692,205 to IBM Corporation (1987). H. A. Protschka (IBM), European Patent Application 0 257 255 (1987).

One such solvent-soluble release layer material is polysulfone. This material has the advantage of enabling the liftoff of metal mask layer by conventional solvent stripping. Although the material also serves to insulate and protect the metal substrate from attack by harsh oxidative strippers, it all the same requires such harsh strippers to liftoff the photoresist layer if hardened. Polysulfone can serve to liftoff the photoresist material itself as in the fifth step of FIG. 3, but not without other drawbacks.

Such polysulfone release layers are insoluble to conventional alkaline developing solutions. Accordingly, unlike the photoresist they are not "wet-developable". Patterns in the release layer must be made by "dry-development" with, for example, reactive ion etching. In fact, little if any commercial use has been made of these special release layers, in large part because they must be dry-developed.

In conventional microlithography, micron feature sizes developed by dry etching are excessively more expensive than wet etching. Additionally, the dry developable release layer material requires separate plasma etching equipment in addition to that required to etch the photoresist layer and other layers of multilayer microlithographic processing. The addition of even more equipment and more steps becomes such a serious drawback that those in the art have preferred the toxicity, disposal, and other restrictions associated with employing non-conventional strippers, to remove the photoresist layers, rather than deal with a dry-developable release layers. Some otherwise acceptable release layer materials do not adhere sufficiently to semi-conductor substrates or are incompatible surfaces for applying resist layers, or other organic or inorganic layers, thereto.

Accordingly, a wet-developable release layer of material that could be co-developed concurrently with the photoresist material, without requiring separate plasma etching equipment, and which could be lifted off by immersion in more mild and less toxic solvents and which would not erode metallized substrates, while providing good adhesion to semiconductor substrates and a compatable surface for applying resist layers, or other organic or inorganic layers, would be a surprising advancement in the art fulfilling a long felt need in the industry.

SUMMARY OF THE INVENTION

It is therefore a principle object of the present invention to provide a new and improved wet-developable, release layer composition for multilayer microlithography which permits, otherwise insoluble, photoresist layers to e lifted off by mild, non-toxic, conventional strippers.

It is another principle object of the present invention to provide a polyamic acid/imide release layer which remains soluble in alkaline media even after substantial thermal imidization.

It is a further object of the present invention to provide a new and improved method for making wet-developable release layers in multilayer microlithography concurrently wet-developable with the positive-working photoresist.

It is an additional object of the present invention to provide a new and improved microlithographic process for concurrently wed-developing a photoresist layer along with its release layer and lifting off the photoresist with conventional strippers whereby the need for dry-developed release agents, separate plasma processing equipment, and other additional steps and/or expense is negated.

It is also an object of this invention to provide a new and improved material for liftoff of overlying, nonimaged film.

These objects and other others are generally fulfilled by a new and improved polyamic acid (ester)/imide polymer composition with regularly interposed nonamic acidic-functional moieties along the polymer backbone which are abnormal to the amic acid structure. These compositions may be employed as a release layer, sandwiched between a semiconductor substrate and a photoresist layer, concurrently wet-developed with the photoresist, thermally baked, and yet remain soluble in alkaline media for ease of liftoff.

The attached drawings, the following description of the drawings, the detailed description of the preferred embodiments, and the examples will more fully explain and illustrate the invention.

DESCRIPTION OF THE DRAWINGS

FIGS. 1 thru 4 illustrate four alternative prior art processes which employ dry-developable release layer concepts. In each process the photoresist layer is wet-developed, while the release layer is dry-developed with separate plasma etching equipment. Additionally, the photoresist layer, if hardened, must be lifted with harsh strippers which are either toxic and have disposal problems, or would be deleterious to the substrate if the photoresist were removed simultaneously with the release layer.

FIG. 1A-1F illustrates the six principle steps of the IBM Metal Liftoff Process using dry-processable release layers.

FIG. 2A-2F illustrates the six principle steps of a tri-level process using dry-developable planarizing layers (or very thick release layers).

FIG. 3A-3E illustrates the five principle steps of the IBM Ion Milling Process for metal inter layers using dry-developable release layer systems.

FIG. 4A-4G illustrates the seven principle steps of the metal-over-release layer ion planarization mask process.

FIG. 5A-5D illustrates the four principle steps of the imaging process for concurrently wet-developing the release layer and its adjacent positive-working photoresist.

FIG. 6A-6F illustrates a prior art process for application of prior art polyimide coatings starting with a polyamic acid solution, but which polyimide coatings can not be used as release layers for the photoresist.

FIG. 7 illustrates a diagram of the polyamic acid chemistry involved in the general manufacturer of such materials.

FIG. 8A-8E illustrates the process of the present invention using wet-developable release layers to assist the removal of high-temperature baked photoresist.

FIG. 9A-9D illustrates ion implantation processes using the wet-developable release layer process of the present invention.

FIG. 10A-10D illustrates metal liftoff processes using the wet-developable release layer compositions of the present invention.

FIG. 11A-11D illustrates processes using the wet-developable release layers of the present invention as a planarizing film.

FIG. 12A-12B illustrates processes using the wet-developable film of the present invention to remove an epoxy encapsulant.

DETAILED DESCRIPTION AND PREFERRED EMBODIMENTS

Figure 13A:
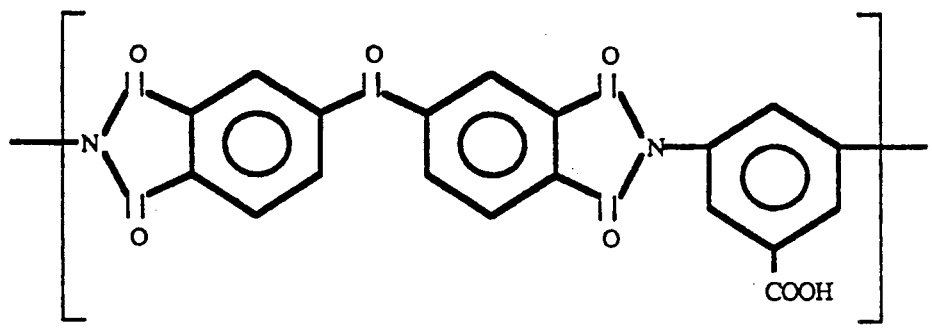
FIG. 13 illustrates the formulas of a+b two polyimide resins useful as release layers in the present invention.

The release layer compositions of the present invention are generally derived from the polyamic acid chemistry depicted at FIG. 7 but with critical differences from past polyamic acid/imides.

In the past, such polyimide coatings have been generally offered for use in microlithographic processes because they have good chemical resistance, high temperature stability, and good dielectric properties. They have been used as one of a few organic materials which can replace glass dielectrics and passivation coatings in IC devices. In FIG. 7, the letter R equals —CH$_2$—, —O—, —S—,

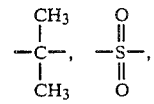

and other bridging groups and the letter n represents the number of repeat units in the polymer and is usually greater than 10.

These compositions are not normally spin-coated directly from solution i the polyimide form. Instead they are applied by spin-coating in the precursor polyamic acid form. The polyamic acid precursor then is heated to approximately 170 degrees C to remove the solvents and to partially imidize the film. This allows a controllable etch rate in alkaline developers as the composition is then patterned along with a photoresist layer. After patterning and stripping the resist, the polyamic acid film is heated to above 200 degrees C to complete the imidization and remains on the substrate.

There is a strong inverse relationship between temperature and solubility which renders these prior art polyamic acids of little use in release layer technology. That is, prolonged exposure to temperatures above 150 degrees C and substantial imidization reduce the level of solubility in alkaline media to the point that such polyamic acid/imides would normally be of little use as a release layer.

Nevertheless, in accordance with the present invention it has been discovered that polyamic acid/imide compositions, in which acidic functional groups are interposed at regular positions alone polymer backbone, will impart sufficient solubility in alkaline media to convert these materials into useful release layers even after substantial imidization. This occurs with no deleterious effects on the co-development rate of small feature size patterns in the preferred embodiments of the present invention.

The acidic functional groups may include, for example, carboxylic acids (—COOH), aromatic hydroxyls (aryl-OH), and sulfonic acid (—SO$_3$H). Typical acid functionalized polymers may be seen at FIG. 13A and FIG. 13B. It is particularly preferred that the acidic functional moieties be attached to the diamine side of the polyamic acid/imide because it is synthetically more convenient to prepare the functionalized diamines than to prepare functionalized dyanhydrides.

It is important to know that the polyamic acid/imides of the present invention remain sufficiently soluble inspite of the high thermal imidization which would otherwise render prior art polyamic acid/imides unsuitable as release layers.

Diamines with acidic functionalities suitable in condensation reactions for preparing compositions of the present invention are commercially available. Among the preferred group of such diamines is as follows:
3,5-diaminobenzoic acid (and other isomers such as the 3,4-isomer),
3,3'-dihydroxy-4,4'-diaminobiphenyl,
o-tolidine disulfonic acid,
2,4-diaminophenol,
3-amino-4-hydroxyphenyl sulfone,
3,3'-dicarboxy-4,4'-diaminobiphenyl,
2,4-diamino-6-hydroxypyrimidine,
2,5-diaminobenzensulfonic acid, Many dianhydrides can be used to react with the functionalized diamines. Suitable dianhydrides include the following:
3,3'4,4'-benzophenone tetracarboxylic dianhydride (BTDA) pyromellitic dianhydride (PMDA)
3,3', 4,4'-biphenyl tetracarboxylic dianhydride (BPDA) diphenylsulfone -3,3',4,4'-tetracarboxylic dianhydride.

Figure 13B:
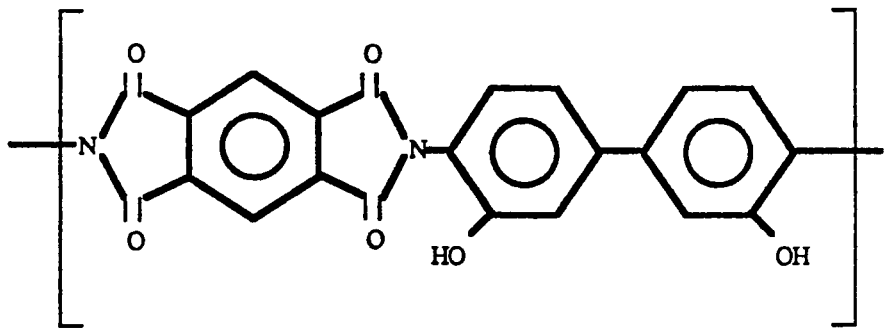

Two especially preferred release layer compositions, shown in FIGS. 13a and 13b, are copolymers of 3,5-diaminobenzoic acid and BTDA and 3,3'-dihdyroxy-4,4'-diaminobiphenyl and PMDA.

Materials resembling the hydroxy polyimide shown in FIG 13b were recently reported by Khanna and Mueler (10) as being suitable bases for high temperature-stable positive photoresists. These materials were based on diamines and dianhydrides with fluorinated bridging groups. They are unsuitable for purposes of the present invention because they are soluble in photoresist solvents and can be removed when the resist is spincoated. Moreover, they are extremely expensive.

Only a few combinations of the above diamines and dianhydrides are spincoatable in the form of polyimides. Accordingly, it is particularly preferred in the process of this invention to spincoat the materials as polyamic acids and then thermally cure them to the polyimide form before development.

Preferred solvent systems for polyamic acid preparation and spincoating include alkyl amides such as N-methylpyrrolidone and dimethylacetamide, methyl sulfoxide, cyclic ketones such as cyclohexanone, and glymes such as 2-methoxyethyl ether.

The development rate of the polyimide release films in aqueous base is highly dependent on the polymer structure. Generally speaking, the greater the level of acidic functional moieties on the polyimide, the faster the development rate. Some monomer combinations yield polyimides which develop too fast at desired bake temperature and cannot be patterned to small feature sizes, for example, 3,5 diaminobenzoic acid and PMDA rather than BTDA baked for 30 minutes at 200 C rather than BTDA. In such instance it is preferred that the development rate be reduced by including other diamine components which do not bear acidic functional groups into the polymer structure. High molecular weight aromatic diamines are particularly useful in this regard since they have a large dilution effect on the polymer repeat unit. A large number of such diamine materials have been described in the literature, for example, see the general reference "Polyimides: Synthesis, Characterization, and Applications," Vols. I & II; K. L. Mittal, Ed.; Plenum Press, New York (1984). A few preferred diamines are
4,4'-oxydiamiline, or ODA, (particularly when copolymerized with PMDA),
2,2-bis [4-(4-aminophenoxy)phenyl propane, or BAPP, bis[4-(4-aminophenoxy)ophenyl]sulfone, or BAPPS.

One particularly preferred embodiment of this invention comprises terpolymers of 3,5-diamiobenzoic acid/BTDA/BAPPS wherein the mole ratio f 3,5-diaminobenzoic acid to BAPPS is 2:1 to 4:1.

Another way to slow the development rate of the release layer films, but without resorting to strucutural modifications, is through the use of additives. These include compatible polymers with low developer solubility and reactive-low-molecular weight (MW) compounds which are capable of crosslinking the release layer polymer.

Multinational epoxides compounds are especially effective, low MW additives. In a preferred embodiment of the invention it is not necessary to completely imidize (to more than 50%) release films before they are developed when these additives are present. Unlike other uses of these additives, the extra acidity contributed by an uncyclized amic acids is apparently compensated for by the additive. A related benefit of additive use is that the curing temperature of the film can be reduced. Traditional bisphenol A-type epoxy resins and cycloaliphatic diepoxides are effective additives when used at 1–20 wt. % based on polyamic acid solids.

An alternative means for reducing the imidization requirements is to modify the polymer by esterifying acid positions of the amic acid group with either an aromatic or aliphatic alcohol. This causes essentially the same change in solubility as imidization. If esterification is employed, the bake requirements may be reduced to as low as 100 C. Other release layer properties such as high temperature stability and solubility in alkaline media are unaffected.

In accordance with the preferred method of this invention the polyamic acids are prepared as follows: The diamine (s) is (are) charged into a sealable reactor fitted with a heavy stirrer and nitrogen purge. It is dissolved in a portion of the solvent. The dynahydride is then washed into the stirring diamine solution with the balance of the solvent to give a dianhydride/diamine mole ratio in the range 0.700–1.100. Ratios in the range 0.85–1.00 are preferred. The solution is allowed to stir at ambient temperature for 24 hours to complete the polymerization. The polymer solids level is usually adjusted to 10–25 wt. %.

The polyamic acid solution is diluted to any convenient level needed to obtain a desired film thickness when spincoated. Additives, if necessary, should be dissolved in the polyamic acid solution using vigorous mixing. After formulation, the products are preferably stored under refrigerated conditions to preserve physical and chemical properties. Thereafter, they may be distributed and employed as release layers in microlithographic imaging processes.

The basic imaging process for the polyimide release layer compositions is described in FIG. 5. The processes described in FIGS. 8-11 are standard schemes which may use release layer composition of the present invention. The unique properties of base-soluble polyimides also makes them applicable to these, device-related processes where intractable layers must be removed. These processes may or may not entail photoimaging.

The release layer materials are useful on all semiconductor substrates including silicon, silicon dioxide, silicon nitride, silicon carbide, glasses, gallium arsenide, aluminum and other metals. Application of an adhesion promoter, such as hexamethyldisilazane or an organotrialkoxysilane, to the substrate before coating the release film does not deteriorate performance and may be employed if desired for certain types of lithographic quality.

After spincoating, the release film is preferrably baked to cause more than 80% imidazation of the film unless esterified polymers or low MW additives are used. Preferred bake temperatures lie in the range 140°-250° C. The most preferred temperature (which provides the best lithographic control), is obtained by correlating the structure of the release polymer and the type of solvents used for spincoating. For example, higher bake temperatures are required for thick films spun from heavy solvents such as N-methyl-pyrrolidone.

Convection oven baking, infrared track, and hotplate baking give acceptable results. Oven bake times range from 5-120 minutes; hotplate bake times range from 15-300 seconds. Where desired, imidization can also be achieved by chemical techniques including exposure to gaseous reagents and high energy beams.

Application of the positive photoresist, softbaking, exposure and development may follow the procedures recommended by the manufacturer of the photoresist.

The preferred developers are aqueous solutions of sodium or potassium hydroxides, tetramethylammonium hydroxide, choline hydroxide, and other aqueous alkalies. During the development step, the photoresist is etched away first, exposing the release layer film, which is developed concurrently although second in sequence. The time required to develop the release layer film will depend on its thickness, its thermal history and its structure. Preferably 5 to 120 seconds is sufficient. Overdevelopment is preferrably avoided because it will continue to undercut beneath the resist (FIG. 5). In liftoff processes (FIG. 10), however, a certain degree of undercut is preferred.

A variety of processing steps may occur before the photoresist is lifted (by dissolving the release layer). These include substrate etching by wet or dry methods, metal deposition, glass deposition ion implantation and various high temperature processes. The good chemical resistance and excellent high temperature stability of polyimide release films means that they will pass through these steps largely unaffected.

Release of the resist is accomplished by immersing or spraying the specimen wit an alkaline solution that dissolves the release layer component. A room temperature photoresist developer or heated developer comprising aqueous alkali can often serve as the release bath. Sometimes, at higher processing temperatures, flowed resist may cover the exposed edges of the release layer pattern and impede the penetration of the aqueous alkali release bath into the release layer.

In these instances, it is preferred to add to such a release bath an organic solvent to assist penetration such as glycol ether and/or N-methyl-pyrrolidone. In a particularly preferred embodiment a nonaqueous alkaline media is employed comprising organics such as glycol ethers or N-methylpyrrolidone with the nonaqueous alkali ethanolamine. This nonaqueous alkaline component, such as ethanolamine, can be particularly effective to cause dissolution of the polyimide release films where simple organic solvent mixtures are not effective alone. The immersion or spray time required to lift the resist varies with the processing conditions. Complete resist removal generally occurs within 1-60 minutes under immersion conditions.

The processes of the invention have been described with the use of positive photoresists because of their preferred use in the microelectronics industry and the codevelopment objective. In principal, the polyimide release layer materials of this invention can be equally applicable to processes involving electron beam, x-ray, negative and deep UV resists.

These imaging systems, however, require an organic solvent mixture as the developer rather than aqueous alkali. Since polyimide release films are highly resistant to organic solvents, this does not present a problem, but a two-step development procedure would be needed; first using an organic solvent to develop the resist, then the release layer would be developed using aqueous base.

GLOSSARY OF TERNS 1. positive photoresist—Usually a mixture of an alkali-soluble phenolic resin (novolac) and a photosensitive dissolution inhibitor. In this form, the mixture cannot be dissolved in aqueous alkali to produce an image. Exposure of the resist to UV light causes the photoinhibitor to chemically rearrange forming a carboxylic acid compound. This compound and the phenolic resin can then be etched away by aqueous base (or developer) to create a positive image. Hence, the term "positive-working" resist.
2. planarization—The ability of a polymer coating to create a level surface when spincoated over irregular topography.
3. strippers—Liquid chemical media used to remove photoresists after processing is finished. Strippers are normally of two types: 1) mixtures of strong aqueous acids or bases with hydrogen peroxide, and 2) organic solvent mixtures which may contain organic bases to speed attack on positive photoresist.
4. developers—For positive resists, generally 1-10% aqueous solution of an alkali metal hydroxide or a tetraalkylammnoium hydroxide. The solutions may also contain buffers and surfactants.

wet-developed or wet-processed—Refers to an etching process wherein an aqueous developer is used to pattern a photoresist or release layer film.
6. wet-etching—Any etching process for resist, glass, silicon, etc., which involves a liquid etchant.

7. dry-developed or dry-processed—Refers to an etching process wherein an aqueous developer is used to pattern a photoresist or release layer film or other layer within a masking structure.
8. dry-etching—Any process for resist, glass, silicon, etc., which uses reactive ions as the active etching species.
9. plasma-developed or plasma-processed—Same as 7, but ion source is nondirectional, i.e. it etches isotropically.
10. reactive ion etching on (RIE)—Same as 8, but ion stream is focussed so that it etches only in the direction of focus.
11. Ion implantation—The use of a high energy ion beam to introduce dopant atoms into semiconductor substrates.
12. ion milling—Similar to 10, but the ion species is concentrated into a high energy beam.
13. glasses and dielectrics—Electrically insulating inorganic coatings such as silicone dioxide, silicon carbide, and silicone nitride. Sometimes used as a mask for dry-processing of underlying organic films by oxygen plasma or oxygen RIE. Glasses may be grown at high temperature, e.g silicon dioxide coatings at about 1000° C. in the presence of water vapor. They may also be produced by chemical vapor deposition (CVD) which involves the introduction of reactive gases over a substrate at high temperatures. Still another technique is the application of spin-on-glass coatings (SOG's ). SOG's are solutions of organosilicon compounds which form loosely structured glasses when heated at high temperatures.
14. sputtering—A coating process wherein collision of a ionized gas with a metal target causes metal atoms to be transferred from the target onto a substrate.

The following examples and tables are illustrative of the invention.

EXAMPLE 1

A variety of wet-developable polyimide release layers we re prepared and demonstrated using the following procedures: The materials shown in Table 1 were applied in their polyamic acid form onto these three inch silicon or silicon dioxide wafer substrates by spin-coating. Solution solids were adjusted to approximately 6 wt. % to give a 2000-2500A film when spin at 4000 RPM for 60 seconds. The films were then imidized by baking. Bake temperatures wer correlated to provide the best lithography at 1-2 micron feature sizes. Positive photoresists (SHIPLEY MICROPOSIT 1470) were spun over the release films at 5000 RPM for 30 seconds and then softbaked at 110° C. for 15 minutes on an infrared track. Final resist thicknesses were about 1 micron. The wafers were developed in a room temperature solution of 1:1 (v/v) SHIPLEY Microposit-MF-312 and deionized water. (MF-312 is a concentrated aqueous solution of tetramethylammonium hydroxide and buffers.) Development time ranged between 5 and 15 seconds to give good quality 2.0 micron geometries concurrently in both the resist and the release layers. The ability to lift the resist after high temperature baking of the release layer-resist composite was used to test release capability. The test specimens were baked at 200° C. for 30 minutes in a convection oven after development. This treatment rendered the resist virtually insoluble in conventional commercial organic strippers, organic solvents (excluding hot phenols), and aqueous-base developers.

Control wafers with photoresist coated directly over the substrate (no release film was present) showed less than 5% pattern removal within 15 minutes when placed in the release baths. Although the control test are not shown in Table 1 each control used unidentical release bath to its respective release sample. With the release film present, however, more than 90% of the pattern could be lifted within 15 minutes. Two release baths were tested. The first [BATH 1] warm developer (60° C.); the second [BATH 2] was a 60/20./20 (v/v/v) mixture of dipropylene glycol methyl ether, N-methyl-pyrrolidone and ethanolamine heated to 65° C.

Table 1 gives the composition of the release materials and other pertinent conditions which provided the lithographic quality and release results indicated.

TABLE 1

| | Substrate | Monomers/Moles | Solvent | Additive Conditions | Imidization Conditions | Release Bath | Results |
|---|---|---|---|---|---|---|---|
| (1) | Silicon | 3,5 diamino-benzoic/1.0 BTDA/1.0 | N-methyl pyrrolidone and diglyme | none | 210° C. for 30 Minutes in oven | 2 | Greater than 90% release in 5 minutes |
| (2) | Silicon Dioxide | 3,5 diamino-benzoic/1.0 BTDA/1.0 | N-methyl pyrrolidone and diglyme | none | 210° C. for 30 Minutes in oven | 2 | Greater than 90% release in 5 minutes |
| (9) | Silicon | 3,5 diamino-benzoic/1.0 BTDA/1.0 | N-methyl pyrrolidone and diglyme | Cycloaliphatic diepoxide (Cyracure 6100) by Union Carbide 10 Wt. % of nomer solids | 195° C. for 30 minutes in oven | 2 | Greater than 90% release in 5 minutes |
| (3) | Silicon | 3,5 diamino-benzoic/1.0 BTDA/1.0 | N-methyl pyrrolidone and diglyme | none | 210° C. for 30 minutes in oven | 1 | Greater than 90% release in 5 minutes |
| (4) | Silicon | 3,5 diamino-benzoic/0.75 BAPP/0.25 BTDA/1.0 | N-methyl pyrrolidone and diglyme | none | 190° C. for 30 minutes in oven | 2 | Greater than 90% release in 5 minutes |
| (5) | Silicon | 3,5 diamino-benzoic/0.75 BAPP/0.25 BTDA/1.0 | N-methyl pyrrolidone and diglyme | none | 195° C. for 2 minutes on hotplate | 2 | Greater than 90% resist release in 5 minutes |
| (6) | Silicon | 3,5 diamino-benzoic/0.75 BAPP/0.25 BTDA/1.0 | N-methyl pyrrolidone and diglyme | none | 190° C. for 30 minutes in oven | 1 | Greater than 90% resist release in 5 minutes |
| (7) | | 3,5 diamino- | N-methyl | none | 200° C. for 30 minutes | 2 | Greater than 90% |

TABLE 1-continued

| | | | | | | |
|---|---|---|---|---|---|---|
| | benzoic/0.75 BAPPS/0.25 BTDA/1.0 | pyrrolidone and diglyme | | in oven | | resist release in 5 minutes |
| (8) Silicon | 3,5 diamino- benzoic/0.75 BAPPS/0.25 BTDA/1.0 | N-methyl pyrrolidone and diglyme | none | 200° C. for 30 minutes in oven | 2 | Greater than 90% resist release in 5 minutes |
| (10) Silicon | Same as Sample 1 | N-methyl pyrrolidone and diglyme | A epoxy resin (Shell Epon 828) 10 wt. % of monomer solids | 195° C. for 30 minutes in oven | 2 | Greater than 90% resist release in 5 minutes |
| (11) Silicon | 3,5 diamino- benzoic/0.75 BAPPS/0.25 BTDA/1.0 | N-methyl pyrrolidone and diglyme | Union Carbide Cyracure 6100 Cycloaliphatic diepoxide at 10 wt. % of monomer solids | 175° C. for 30 minutes in oven | 2 | |
| (12) | 3,5 diamino- benzoic/0.75 BAPPS/0.25 BTDA/1.0 | N-methyl pyrrolidone and diglyme | Union Carbide Cyracure 6100 Cycloaliphatic diepoxide at 10 wt. % of monomer solids | 190° C. hotplate for 2 minutes | 2 | 90% release |
| (13) Silicon | 3,5 diamino- benzoic/0.80 ODA/0.20 BTDA/1.0 | N-methyl pyrrolidone and cyclohexa- none | none | 200° C. for 30 minutes | 2 | 90% release |
| (14) Silicon | 3,5 diamino- benzoic/1.0 BPDA/1.0 | N-methyl- pyrrolidone and cyclohexa- none | none | 50° C. for 30 minutes in oven | 2 | 90% release |
| (15) Silicon | 3,5 diamino- benzoic/0.75 BAPPS/0.25 BPDA/1.0 | N-methyl- pyrrolidone and cyclohexa- none | none | 200° C. at 30 minutes | 2 | 90% release |
| (16) | 3,3' dihydroxy-4,4'- dianinobiphenyl/1.0 PMDA/1.0 | N-methyl- pyrrolidone and cyclohexa- none | none | 200° C. at 30 minutes | 2 | 90% release |
| (17) Silicon | Same as sample 16 but BTDA instead of PMDA | N-methyl- pyrrolidone and cyclohexa- none | none | 200° C. at 30 minutes | 2 | >90% release in 10 minutes |
| (18) Silicon | Same as Sample 1 | Same as Sample 1 | Same as Sample 1 | Same as Sample 1 | 70° C. N-methyl pyrrolidone | No resist removal because no alkaline component was present |

ADDED EXAMPLES

19. Same criteria and results as Example 7, but polymer prepared in 75/25 diglyme/cyclohexanone. Imidization conditions were 190° C./2 min. on hotplate.
20. Same criteria and results as Example 7, but 1.0 mole PMDA used to make polymer rather than BTDA.
21. Same criteria and results as Example 7, but substrate was silicon dioxide.
22. Same criteria and results as Example 7, but substrate was aluminum.
23. Same criteria and results as Example 7, but imidization conditions were 205° C./2 minutes on a hotplate.

We claim:

1. A method for making a wet-developable, polyamic acid/imide microlithographic polymer lift-off coatings, having improved resistant to thermal insolubiliation in alkaline media comprising:
   (a) reacting, in suitable solvent to produce the polyamic acid,
   nonamic acid functionalized diamines,
   an effective amount of a suitable dianhydride, to interpose the acidic functional moieties at regular molar equivalent positions along the polymer backbone;
   (b) coating the polyamic acid form onto a microelectric substrate as the lift-off coating;
   (c) thermally curing the lift-off coating to render it insoluble in organic solvent and to impart at least 80% imidization;
   (d) coating over the lift-off layer with a positive photoresist dissolved in organic solvent;
   (e) photo imaging the overcoated photoresist and developing patterns in the lift-off coating concurrently after patterns are developed in the photoresist with alkaline developer solution at feature sizes as small as one micron,
   whereby the unexposed lift-off coating remains soluble in alkaline media even after being highly imidized.

2. The method of claim 1 wherein the reaction product of step (a) is esterified and imidization is less than 50%.

3. The method of claim 1 wherein the suitable reaction solvent is selected from the group consisting of N-methylpyrolidone, dimethylacetamide, methyl sulfoxide, cyclohexanone, 2-methoxyethyl ether, and mixtures thereof.

4. The method of claim 1 wherein the functionalized diamines are selected from the group consisting of
   a) 3,5-diaminobenzoic acid or it's 3,4isomer,
   b) 3,3'-dihdyroxy - 4,4'-diaminobiphenyl,
   c) o-tolidine disulfonic acid,
   d) 2,4- diaminophenol,
   e) 3-amino -4- hydroxyphenyl sulfone,
   f) 3,3'-dicarboyx - 4,4'- diaminobiphenyl, g) 2,4-diamino - 6-hydroxyprimidine, and
h) 2,5 -diaminobenzenesulfonic acid.

5. The method of claim 1 wherein the dianhydrides are selected from the group consisting of:
a) pyromellitic dianhydride
b) 3,3′,4,4′-benzophenone tetracarboxylic dianhydride;
c) 4,4′- (hexafluoroisopropylidene) - bis - (phthalic anhydride)
d) 4,4′- oxydiphthalic anhydride,
e) 3,3′4,4′-biphenyl tetracarboxylic dianhydride;
f) diphenyl slfone - 3,3′, 4,4′-tetracarboxylic dianhydride.

6. The method of claim 1, wherein the diamine 3,5-diaminobenzoic acid is reacted with 3,3′, 4,4′-benzphenone tetracarboxylic dianhydride.

7. The method of claim 1 wherein the diamine is 3,3′-dihydroxy - 4,4′-diamine and the dianhydride is pyromellitic dianhydride.

8. The method of claim 6 wherein the suitable reaction solvent is a mixture of N-methylpyrroldione and diglyme.

9. The method of claim 1 wherein a substantial amount of the functionalized diamine is replaced with aromatic diamine which does not contain acidic functional moieties.

10. The method of claim 9 wherein the aromatic diamine is selected from the group consisting of 4,4′-oxydiamiline 2,2-bis[4(4-aminophenoxy)phenyl]propane and bis[4-[4-aminophenoxy) phenyl] sulfone.

11. The method of claim 10 wherein the reactions product is the terpolymer b 3,5 -diaminobenzoic acid 3,3′, 4,4′-benzophenone tetracarboxylic dianhydride/bis [4-[4-aminophenoxy) phenyl] sulfone at a mole ratio f 3,5 -diaminobenzoic acid to BAPPS of 2:1 to 4:1.

12. The method of claim 1 further comprising adding multifunctional epoxy resins or other polymers to slow the development rate without resorting to structural modification.

13. The method of claim 12 wherein the epoxy resins are either bisphenol A-type epoxy resins or cycloaliphatic diexpoxides in amount of from about 1 to 10% by weight of the polyamic acid/amide solids.

14. The method of claim 12 wherein the copolymer 4,4′-oxydiamiline pyromellitic dianhydride is used to slow the development rate.

15. The method of claim 1 wherein the composition is cured at from about 120° C. to about 250° C.

16. The method of claim 1 wherein the suitable reaction solvent is selected from the group consisting of alkylamides, cyclic ketones, and glymes.

* * * * *